(12) United States Patent
Garcia

(10) Patent No.: US 6,775,637 B2
(45) Date of Patent: *Aug. 10, 2004

(54) TEST METHOD AND APPARATUS FOR SOURCE SYNCHRONOUS SIGNALS

(75) Inventor: Rodolfo F. Garcia, San Jose, CA (US)

(73) Assignee: NPTest, LLC, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/439,819

(22) Filed: May 15, 2003

(65) Prior Publication Data

US 2003/0229466 A1 Dec. 11, 2003

Related U.S. Application Data

(63) Continuation of application No. 09/410,569, filed on Oct. 1, 1999, now abandoned.

(51) Int. Cl.[7] .............................................. G06F 17/50
(52) U.S. Cl. ........................ 702/117; 327/261; 714/731
(58) Field of Search .................. 702/117, 79; 714/733, 714/734, 731, 744; 713/401; 348/512; 324/73.1

(56) References Cited

U.S. PATENT DOCUMENTS

| | | | |
|---|---|---|---|
| 4,554,636 A | 11/1985 | Maggi et al. ............... 364/481 |
| 4,813,005 A | 3/1989 | Redig et al. ................. 364/580 |
| 4,837,521 A | 6/1989 | Herlein et al. ................ 328/72 |
| 4,929,888 A | 5/1990 | Yoshida ..................... 371/25.1 |
| 5,289,116 A | 2/1994 | Kurita et al. ........... 324/158 R |
| 5,293,374 A | 3/1994 | Eidson ........................ 364/579 |
| 5,526,286 A | 6/1996 | Sauerwein et al. ......... 364/550 |
| 5,577,236 A | 11/1996 | Johnson et al. ............. 395/551 |
| 5,696,951 A | 12/1997 | Miller ......................... 713/505 |
| 5,774,001 A | 6/1998 | Mozdzen et al. ........... 327/141 |
| 5,875,153 A | 2/1999 | Hii et al. .................... 365/233 |
| 5,946,712 A | 8/1999 | Lu et al. ..................... 711/167 |
| 6,085,345 A | 7/2000 | Taylor ........................ 714/731 |
| 6,167,001 A | 12/2000 | Wu ............................. 368/113 |
| 6,169,435 B1 * | 1/2001 | Fujii et al. .................. 327/261 |
| 6,191,821 B1 | 2/2001 | Kupnicki .................... 348/512 |
| 6,247,136 B1 | 6/2001 | MacWilliams et al. ..... 713/401 |
| 6,452,421 B2 * | 9/2002 | Saito ............................ 326/93 |

FOREIGN PATENT DOCUMENTS

| | | |
|---|---|---|
| EP | 0 136 203 | 8/1984 |
| EP | 0 322 308 | 12/1988 |

* cited by examiner

Primary Examiner—Kamini Shah
(74) Attorney, Agent, or Firm—Dorsey & Whitney LLP

(57) ABSTRACT

A method and associated apparatus for testing devices outputting source synchronous signals using automated test equipment ("ATE"). An output data signal and an output clock signal from such a source synchronous device under test are delayed using a delay network. The delay provides the time required to deskew path errors and to buffer and distribute the output clock signal. The output data signal appears relatively stable to the ATE by reading the output data signal using the output clock signal.

26 Claims, 7 Drawing Sheets

US 6,775,637 B2

TEST METHOD AND APPARATUS FOR SOURCE SYNCHRONOUS SIGNALS

This application is a continuation of U.S. patent application No. 09/410,569, filed Oct. 1, 1999, now abandoned and entitled TEST METHOD AND APPARATUS FOR SOURCE SYNCHRONOUS SIGNALS which is hereby incorporated by reference in its entirety.

BACKGROUND OF THE INVENTION

1. Field of the Invention

This invention relates to methods and circuits for testing electronic devices.

2. Description of the Related Art

To ensure the quality and functionality of electronic devices, such as transistors in an integrated circuit, the devices are tested at various stages of fabrication. The test is usually performed using an automatic test equipment ("ATE"). The ATE injects test signals on the input pins of the device under test ("DUT") and monitors the corresponding output. The output of the DUT is then compared to a known or expected value to determine if the DUT functions in accordance with its specifications.

As device geometry (feature size) becomes smaller, the output signals of devices correspondingly become faster and, unfortunately, also become more "jittery." The jitter is introduced by noise coupling effects within the devices and is exacerbated by lower transistor threshold voltages and large current transients during switching. Further, when using low thermal mass integrated circuit packages, instantaneous semiconductor die temperature changes can occur and vary the timing of the output signals.

To alleviate jitter problems, device manufacturers have resorted to architectures wherein an output clock signal is provided along with an output data signal. Thus, data transfer is synchronized by a clock signal from the source device and not by a clock signal common to all devices in the system. Such output signals are referred to as source synchronous signals. Source synchronous signals are used in a variety of devices including Direct RAMBUS ("RAC") interfaces and high performance microprocessors. FIG. 1 shows waveforms for source synchronous signals 100 consisting of an output clock signal 101 and a corresponding output data signal 102 as "seen" by a receiving device during normal operation. Because the receiving device reads output data signal 102 relative to clock signal 101, very little data jitter is seen by the receiving device.

Although source synchronous signals are relatively stable during normal operation, jitter problems occur during device testing. FIG. 2 shows in a high level block diagram relevant portions of a typical ATE system in the prior art. ATE 200 is configured to test DUT 204, a source synchronous device. ATE 200 includes stimulus generators 201, a read/compare logic 202, a master clock 203, and other conventional portions not shown. Stimulus generators 201 inject test signals into DUT 204. The resultant output signals from DUT 204 are read and compared to an expected value by read/compare logic 202. Because the strobing of test signals into DUT 204 and the reading of the resultant output signals are performed relative to master clock 203 and not relative to the output clock signal of DUT 204, both the output data signal and output clock signal from DUT 204 appear jittery to ATE 200. FIG. 3 shows output data signal 102 and output clock signal 101 from DUT 204 as seen by ATE 200 relative to signals from master clock 203. The jitter in data signal 102 and clock signal 101 can cause false readings which render the test results unreliable or require very tight passing requirements (also known as "guardbands") on the ATE, with a consequential yield loss. Further, the jitter makes it difficult to test timing relationships, such as setup and hold times, between data signal 102 and clock signal 101. Thus, a method and apparatus for reliable testing of source synchronous devices are highly desirable.

SUMMARY

The invention is directed to a method and associated apparatus for testing source synchronous devices using an ATE. An output data signal and an output clock signal of a source synchronous device are delayed using a programmable delay network. The delay provides the time required to deskew path errors and to buffer and distribute the output clock signal. The output data signal appears relatively stable to the ATE by reading the output data signal using the output clock signal.

DETAILED DESCRIPTION

The present invention is directed to a method and associated apparatus for testing source synchronous devices using an ATE. The invention may be used in a variety of ATE's including the ITS 9000 automated test equipment from Schlumberger Technologies Inc. of San Jose, Calif. For example, the invention may be used in the input stage (also known as "Pin Electronics") or compare circuit of an ATE.

Figure 1:
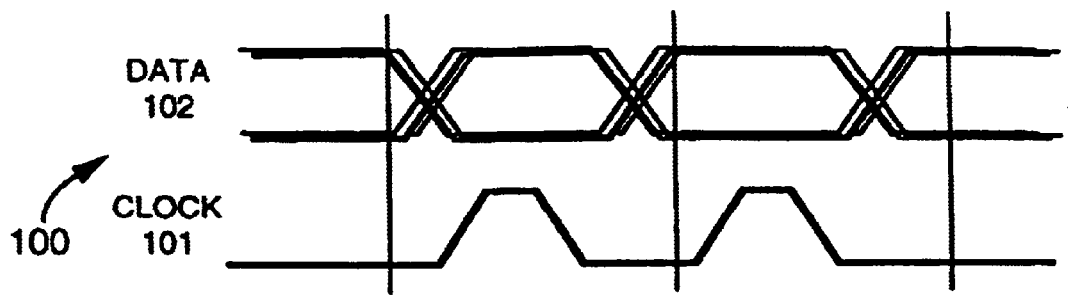
FIG. 1 depicts data and clock signals from a source synchronous device as the signals appear to a receiving device.
Figure 2:
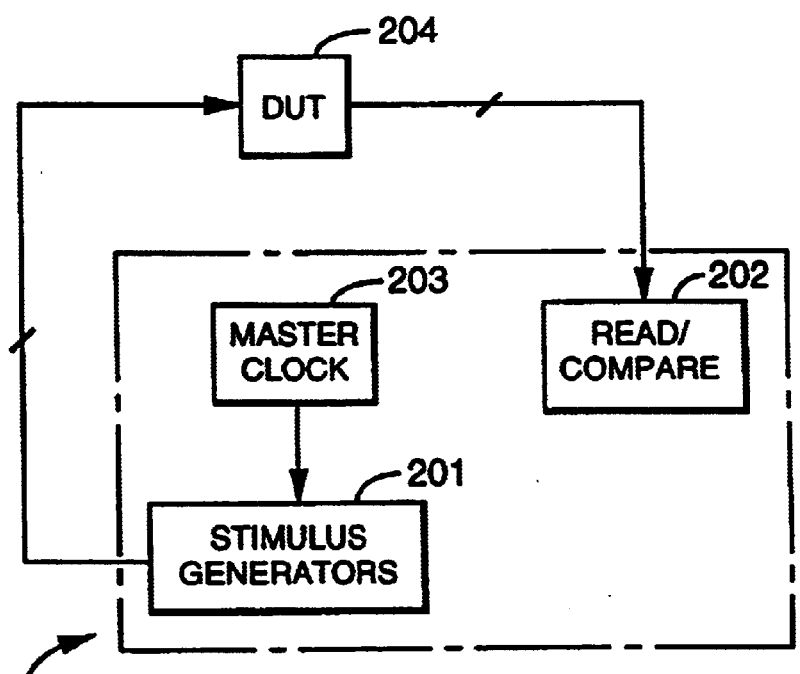
FIG. 2 is a block diagram of an ATE in the prior art.
Figure 3:
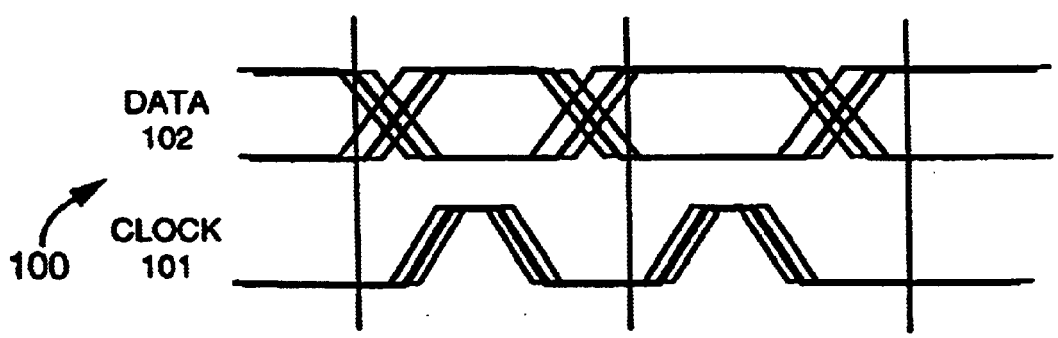
FIG. 3 depicts data and clock signals from a source synchronous device as the signals appear to an ATE in the prior art.
Figure 4:
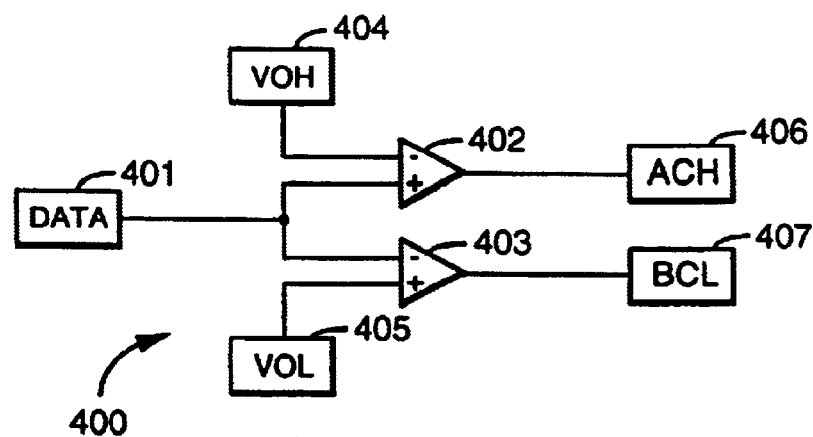
FIG. 4 shows an input stage circuit in the prior art.

FIG. 4 shows an input stage circuit of a typical ATE in the prior art. Such an input stage circuit is used, for example, at the input terminals from DUT 204 of read/compare logic 202 of ATE 200 (FIG. 2). Referring to FIG. 4, a data signal 401 from a source synchronous device is received by comparators 402 and 403. Comparator 402 compares data signal 401 to a reference voltage VOH ("voltage output high") 404. If data signal 401 is greater than VOH 404, output signal ACH 406 ("A-channel HIGH") is a logic HIGH; otherwise, ACH 406 is LOW. The circuit consisting of VOH 404, 402, and ACH 406 is used to test the logic HIGH state of signal 401. For example, VOH 404 can be varied using a programmable voltage source to check the level at which ACH 406 will fail to go to logic HIGH even though signal 401 is HIGH. Similarly, VOL ("voltage output low") 405 can be adjusted to determine the voltage level at which output signal BCL ("B-channel LOW") will fail to go LOW even when data signal 401 is LOW. ACH 406 (or BCL 407) is not buffered and will only remain in its present logic state as long as signal 401 does not transition. Subsequently, ACH 406 (or BCL 407) will be strobed (i.e. read) into a compare logic (not shown) using a clock signal from the ATE. ACH 406 is then compared to an expected value which is based on the DUT input signals generated by the ATE. Because ACH 406 is not read using the DUT's output clock signal, ACH 406 will appear jittery to the ATE. It is possible that ACH 406 will get strobed during the jitter, in which case the reading of ACH 406 will be unreliable.

Figure 5:
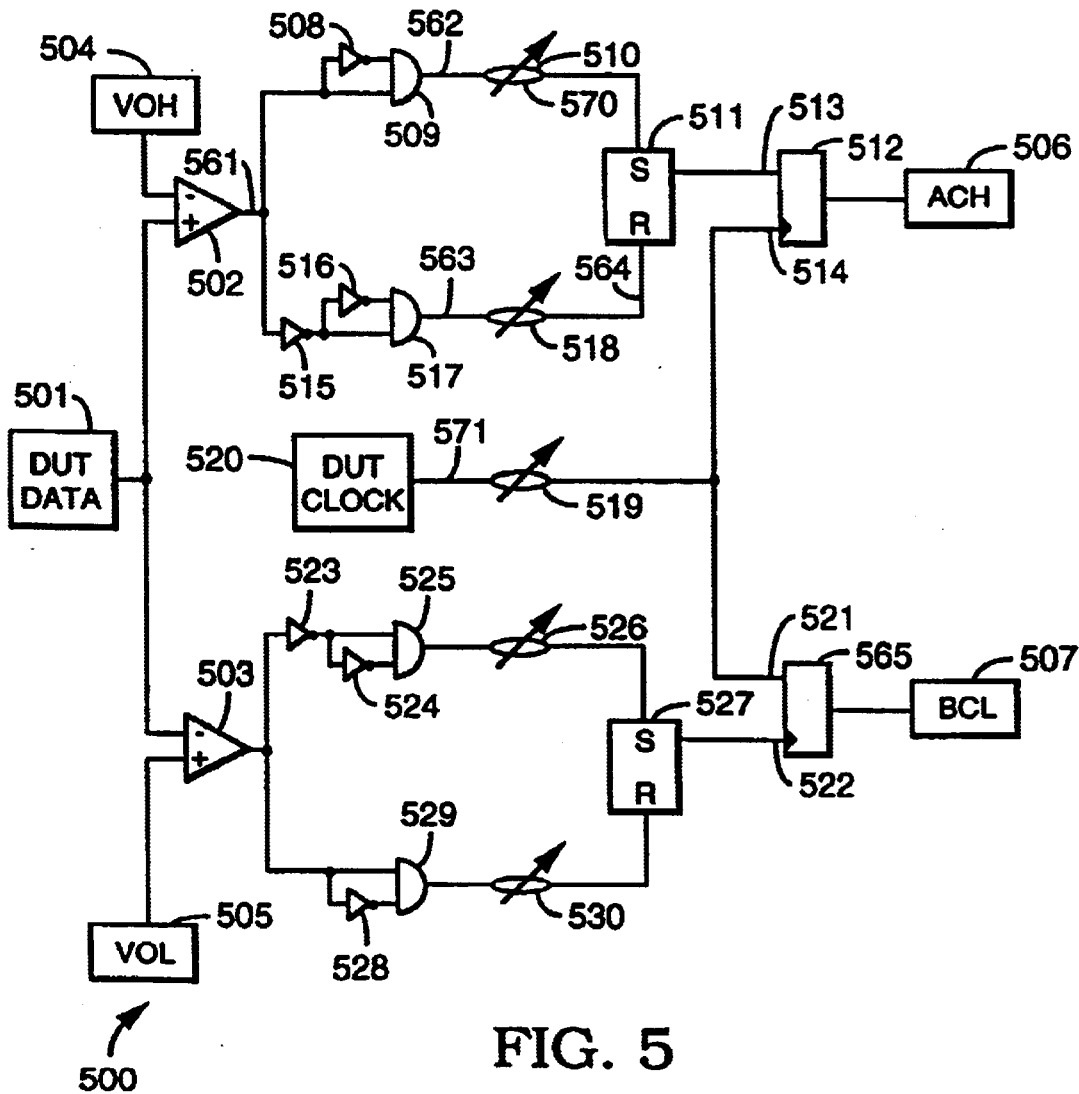
FIG. 5 shows an input stage circuit in accordance with a first embodiment of the present invention.
Figure 6:
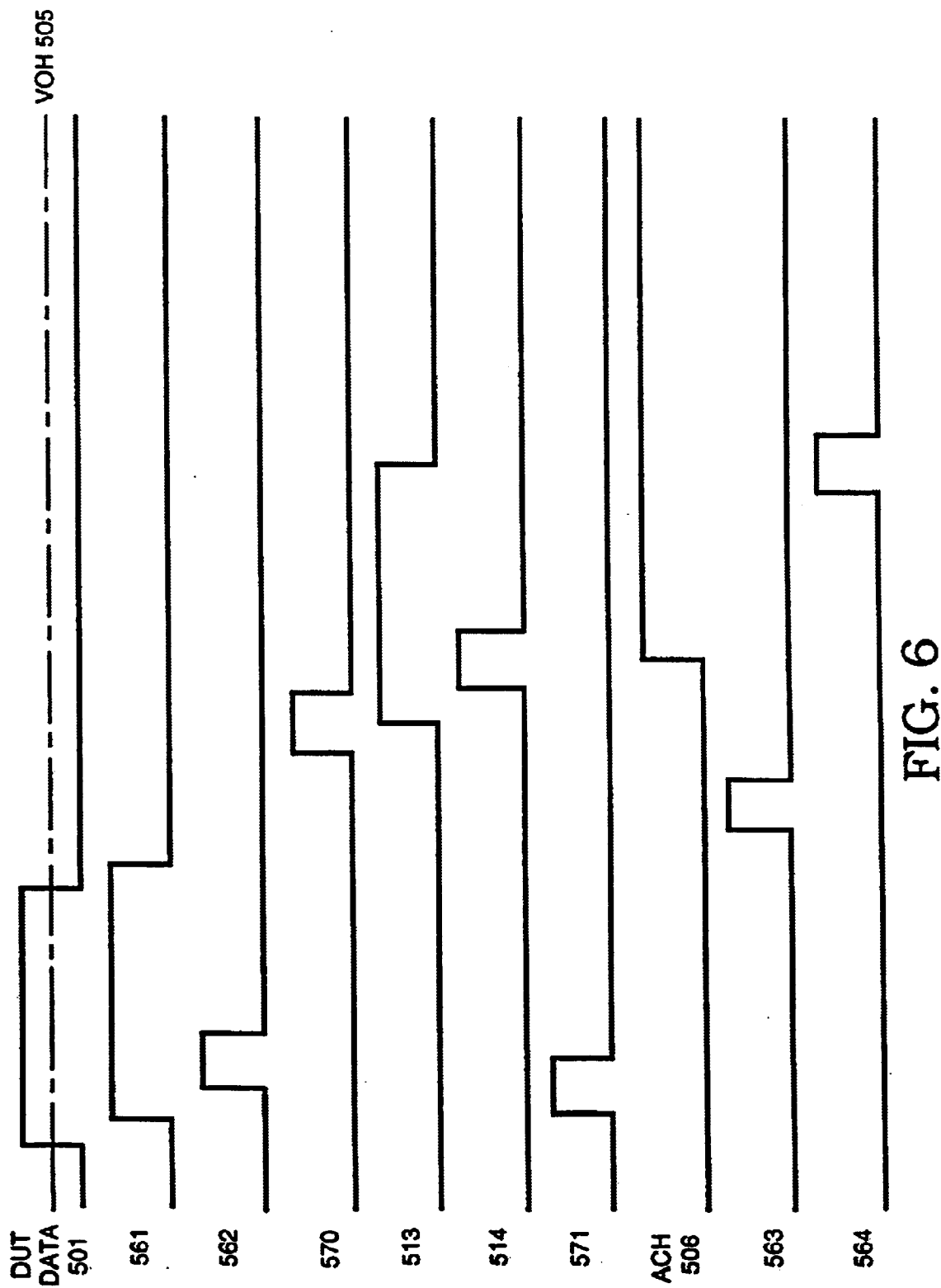
FIG. 6 shows a timing diagram for the circuit shown in FIG. 5.

FIG. 5 shows an input stage circuit 500 for an ATE in accordance with the present invention. When DUT data signal 501 from a source synchronous DUT is HIGH, DUT data signal 501 is compared to a reference voltage VOH 504 by comparator 502. VOH 504 may be an output signal of a digital-to-analog converter or a programmable power supply. VOH 504 is used to test the logic HIGH voltage level of data signal 501. When data signal 501 becomes greater than VOH 504, output signal 561 of comparator 502 will be HIGH. Inverter 508 and AND-gate 509 form a positive edge glitcher circuit for converting the HIGH output of comparator 502 into a narrow positive-going pulse. The narrow pulse is time-delayed by a programmable delay network 510 before triggering the set or "S" input of an S-R flip-flop 511, thereby presenting a logic HIGH to input 513 of latch 512. The programmable delay network may be any suitable conventional delay element or combinations thereof. While data signal 501 propagates through the path defined by comparator 502, delay network 570, and latch 512, a DUT clock signal 520 from the source synchronous DUT is buffered (not shown) and applied on input terminal 571 of programmable delay network 519. After a time delay, clock signal 520 strobes the delayed data signal 501 into latch 512 by triggering clock input terminal 514, resulting in ACH 506 being HIGH. Before the next DUT clock cycle, ACH 506 will be strobed into a comparator circuit (not shown) for comparison with an expected value. When DUT data signal 501 falls below VOH 504, the signal path through comparator 502, a negative edge glitcher circuit consisting of inverters 515–516 and an AND-gate 517, and a programmable delay network 518 works similarly to provide a LOW input to latch 512. FIG. 6 shows a timing diagram which summarizes the aforementioned logic sequence for each relevant signal of FIG. 5.

The circuit for generating BCL 507, which is used for testing the logic LOW state of data signal 501, is analogous to the circuit for generating ACH 506. The path defined by a comparator 503, a negative edge glitcher consisting of inverters 523–524 and an AND-gate 525, and programmable delay network 526 provides a delayed DUT data signal 501 to set S-R flip-flop 527 when DUT data signal 501 is less than a reference voltage VOL 505 (i.e. data signal 501 is LOW). The resultant HIGH output signal of S-R flip-flop 527 is latched into latch 565 by the delayed DUT clock signal 520. When DUT data signal 501 becomes greater than VOL 505 (i.e. data signal 501 is greater than the minimum acceptable output LOW level), comparator 503, a positive edge glitcher consisting of an inverter 528 and an AND-gate 529, and a programmable delay network flip-flop 527, thereby latching a LOW into latch 565 when the delayed DUT clock signal 520 triggers clock input terminal 521.

In marked contrast with methods and circuits in the prior art, ACH 506 (or BCL 507) is generated by strobing data signal 501 using DUT clock signal 520 and not the ATE clock signal. In other words, ACH 506 represents the logic state of signal 501 relative to DUT clock signal 520. Because ACH 506 is buffered using a latch 512, it is a stable signal which can be strobed into a comparator circuit using the ATE clock signal at any time before the next DUT clock cycle.

Programmable delay networks 510, 518, 519, 526, and 530 are used to deskew the path errors of the DUT output data and clock. These path errors can be test fixture path errors, comparator delay errors, and propagation delay differences between positive and negative edge glitchers. Further, the delay networks provide the time delay needed to buffer and distribute DUT clock 520 to all input stage circuits connected to the DUT's data signals. Of course, the maximum propagation delay through circuit 500 must be less than the period of DUT clock signal 520; otherwise, DUT clock signal 520 will lose coherency with data signal 501 and thereby requiring a more complex, pipelined clock fan-out and distribution scheme to match each DUT data with the correct DUT clock edge. For testing high-speed devices, circuit 500 is preferably implemented in an integrated circuit.

Figure 10:
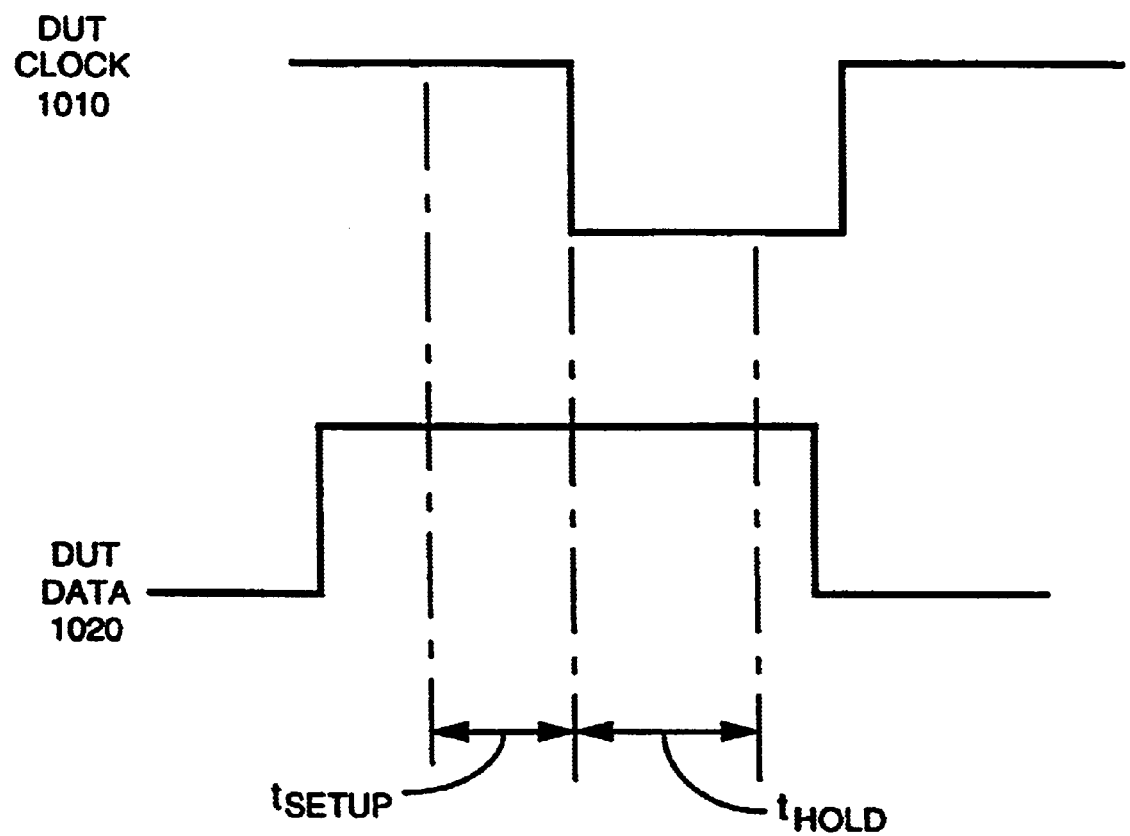
FIG. 10 shows a timing diagram illustrating setup and hold times.

In this embodiment, the delay networks are calibrated such that DUT data signal 501 and DUT clock signal 520 arrive at the input terminals of latch 512 (or latch 565) with the same timing relationship as when they were originally generated by the DUT. The delay networks are preferably adjusted to be in the middle of their programmable delay range to allow for some flexibility in changing the delays to accommodate different DUT timing requirements. Once the delay networks are calibrated, input stage circuit 500 may be used to test for setup and hold times. Setup time testing involves ascertaining that the DUT provides valid data signals for a minimum specified time before the DUT clock transitions in order to meet the setup time requirements of a receiving device (not shown). Referring to FIG. 10, positive setup time $t_{setup}$ is a period of time before DUT clock signal 1010 transitions from HIGH to LOW. To test for positive setup time when the expected DUT data is HIGH, a delay equal to setup time $t_{setup}$ is added to the calibrated delay of delay network 510 (FIG. 5). The same setup time is added to the calibrated delay of delay network 526 if the expected DUT data is LOW. By delaying the DUT data by an amount equal to the setup time and strobing the output of latch 512, it can be determined whether the DUT data signal, which is expected to be HIGH, arrives at the input of latch 512 $t_{setup}$ seconds before the DUT clock transitions.

Hold time involves ascertaining whether the DUT data signal remains valid for a specified time after the DUT clock signal transitions to meet the hold time requirements of the receiving device (not shown). Referring to FIG. 10, hold time $t_{hold}$ is a period of time after DUT clock signal 1010 transitions from HIGH to LOW. To test for positive hold time when expecting a HIGH DUT data signal, a delay equal to setup time $t_{setup}$ minus hold time $t_{hold}$ is added to the calibrated delay of delay network 518 (and 530 if expecting a LOW DUT data signal) or:

$$\text{Delay } 518 = \text{Calibrated\_Delay} + t_{setup} - t_{hold} \quad \text{(Eq. 1)}$$

Setup time $t_{setup}$ is added to the calibrated delay of delay network 518 to compensate for the $t_{setup}$ delay that was added to delay network 510 in performing setup time testing. Hold time $t_{hold}$ is subtracted from the calibrated delay to determine if the expected DUT data state, which is HIGH in this example, remains valid for $t_{hold}$ seconds after the DUT clock signal transitions. Once delay network 518 has the proper delay for hold time testing, the DUT is commanded to transition its DUT data from a HIGH to a LOW. If the DUT data signal remains valid for a period equal to hold time $t_{hold}$ after the DUT clock signal transitions, a HIGH will be latched into latch 512; otherwise, a LOW will be latched.

Figure 7:
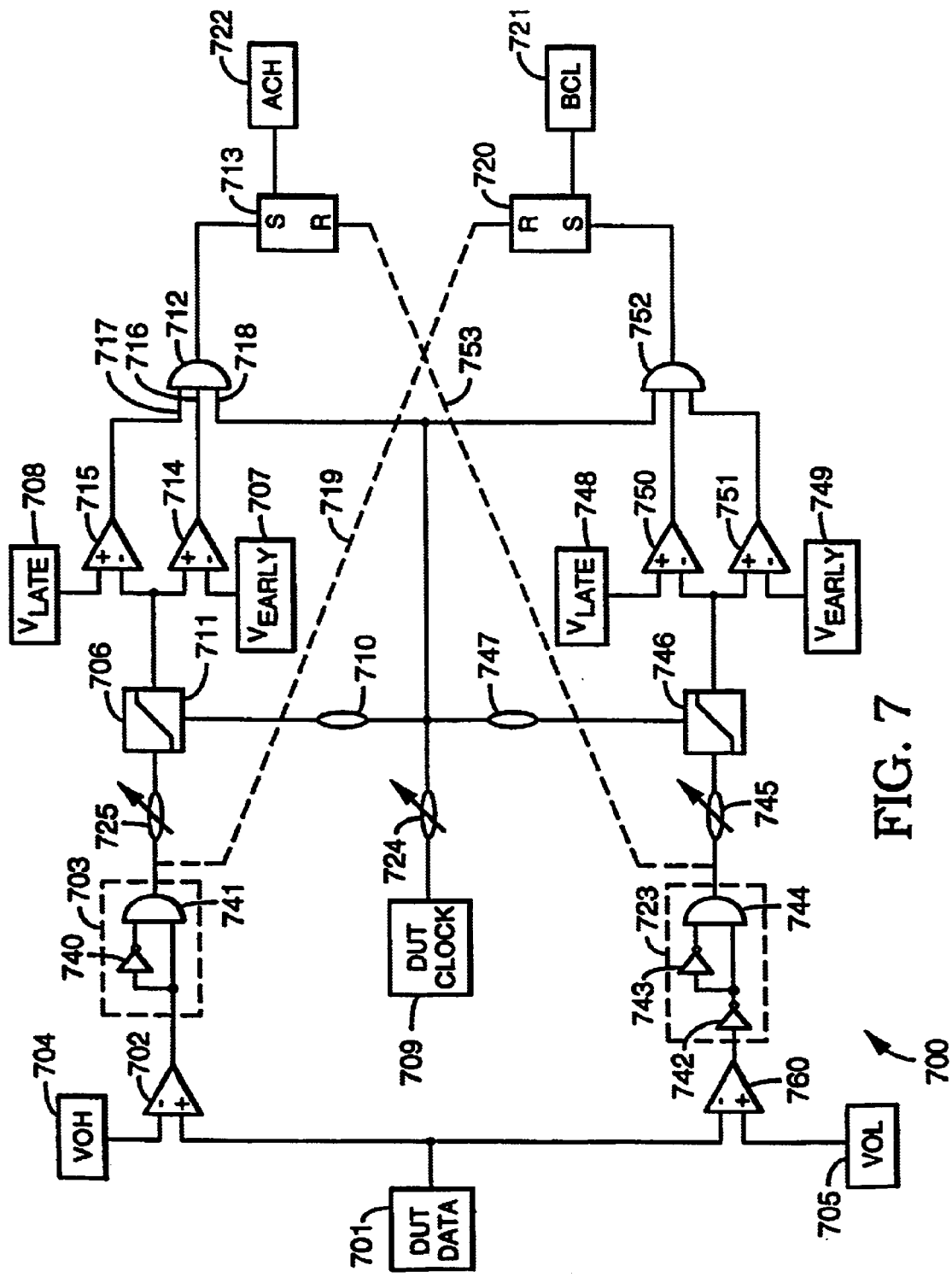
FIG. 7 shows an input stage circuit in accordance with a second embodiment of the present invention.

This approach may also be implemented using a combination of analog and digital techniques. FIG. 7 shows an input stage circuit 700 for an ATE in accordance with the invention. Comparator 702 tests the logic HIGH voltage level of DUT data signal 701 by comparing it to a reference voltage VOH 704. If data signal 701 is greater than VOH 704, comparator 702 outputs a HIGH, triggering a positive edge glitcher 703 which consists of an inverter 740 and an AND-gate 741. In response, positive edge glitcher 703 generates a narrow pulse which is time-delayed by a programmable delay network 725. As in circuit 500, programmable delay networks are employed to deskew path errors and to provide additional time for buffering and distributing DUT clock 709. The narrow pulse from positive edge glitcher 703 also resets an S-R flip-flop 720 as shown by dash line 719. This indicates to circuitry (not shown) which monitors BCL 721 that data signal 701 is HIGH. The output of delay network 725 triggers a conventional ramp generator 706 to start generating a ramp signal. Comparators 714 and 715 compare the ramp signal to reference voltages Vlate 708 and Vearly 707. Because inputs 717 and 716 of AND-gate 712 are HIGH only during a period when the ramp signal has a voltage level between Vearly 707 and Vlate 708, ramp generator 706, in effect, provides additional delay which can be set by adjusting Vearly 707 and Vlate 708. While inputs 716 and 717 are both HIGH, DUT clock signal 709 arrives and applies a logic HIGH on input terminal 718 after a time delay through a programmable delay network 724, resulting in AND-gate 712 outputting a HIGH. Because the HIGH outputs of comparators 714 and 715 represent a delayed data signal 701, gating the comparator outputs with DUT clock signal 709 results in the output signal of AND-gate 712 being the logic state of data signal 701 relative to DUT clock signal 709. This avoids the jitter problem associated with prior art techniques. The HIGH output of AND-gate 712 sets S-R flip-flop 713, thereby buffering ACH 722 for subsequent reading into a comparator circuit using the ATE clock signal. DUT clock signal 709, after a delay through fixed delay networks 710 and 747, resets ramp generators 706 and 746 for the next DUT data signal.

The circuit for generating BCL 721 is analogous to the circuit for generating ACH 722 (FIG. 7) described above. When DUT data signal 701 is less than a reference voltage VOL 705 (i.e. data signal 701 is LOW), comparator 760 outputs a HIGH and triggers a negative edge glitcher 723 consisting of inverters 742–743 and an AND-gate 744. Negative edge glitcher 723 outputs a narrow pulse which is time-delayed by a programmable delay 745 before triggering a ramp generator 746 to output a ramp signal. When the level of the ramp signal is between reference voltages Vearly 749 and Vlate 748, comparators 750 and 751 output a HIGH on the input terminals of an AND-gate 752. The delayed DUT clock signal 709 arrives at an input terminal of AND-gate 752 and gates the HIGH output signals of comparators 750–751, which represent a delayed DUT data signal 701, thereby causing AND-gate 752 to output a HIGH. This results in S-R flip-flop 720 being set and BCL 721 being HIGH, indicating that DUT data signal 701 is LOW. As indicated by dash line 753, negative edge glitcher 723 also resets S-R flip-flop 713 to indicate to the circuit (not shown) which monitors ACH 722 that DUT data signal 701 is LOW.

Figure 8:
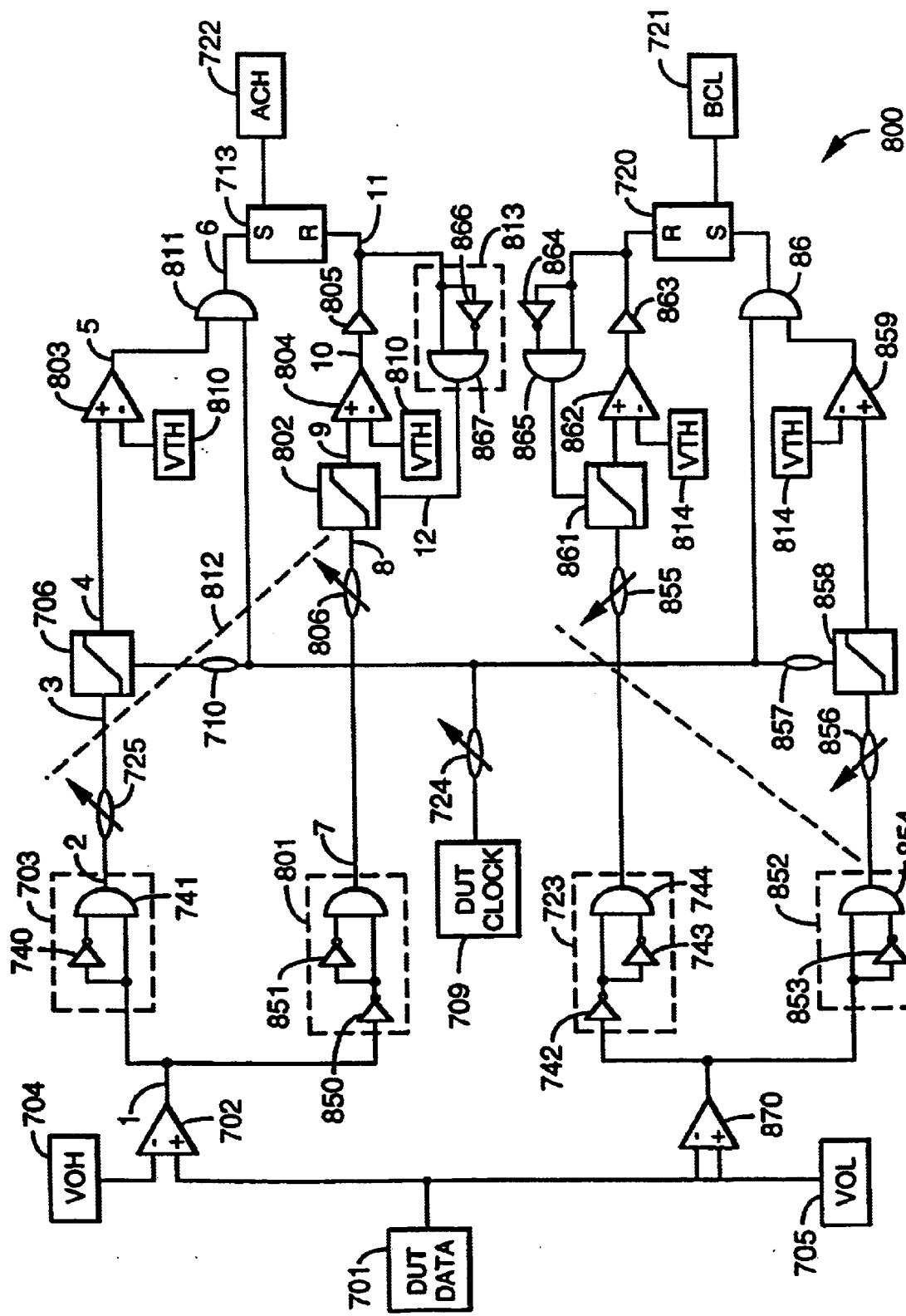
FIG. 8 shows an input stage circuit in accordance with a third embodiment of the present invention.
Figure 9:
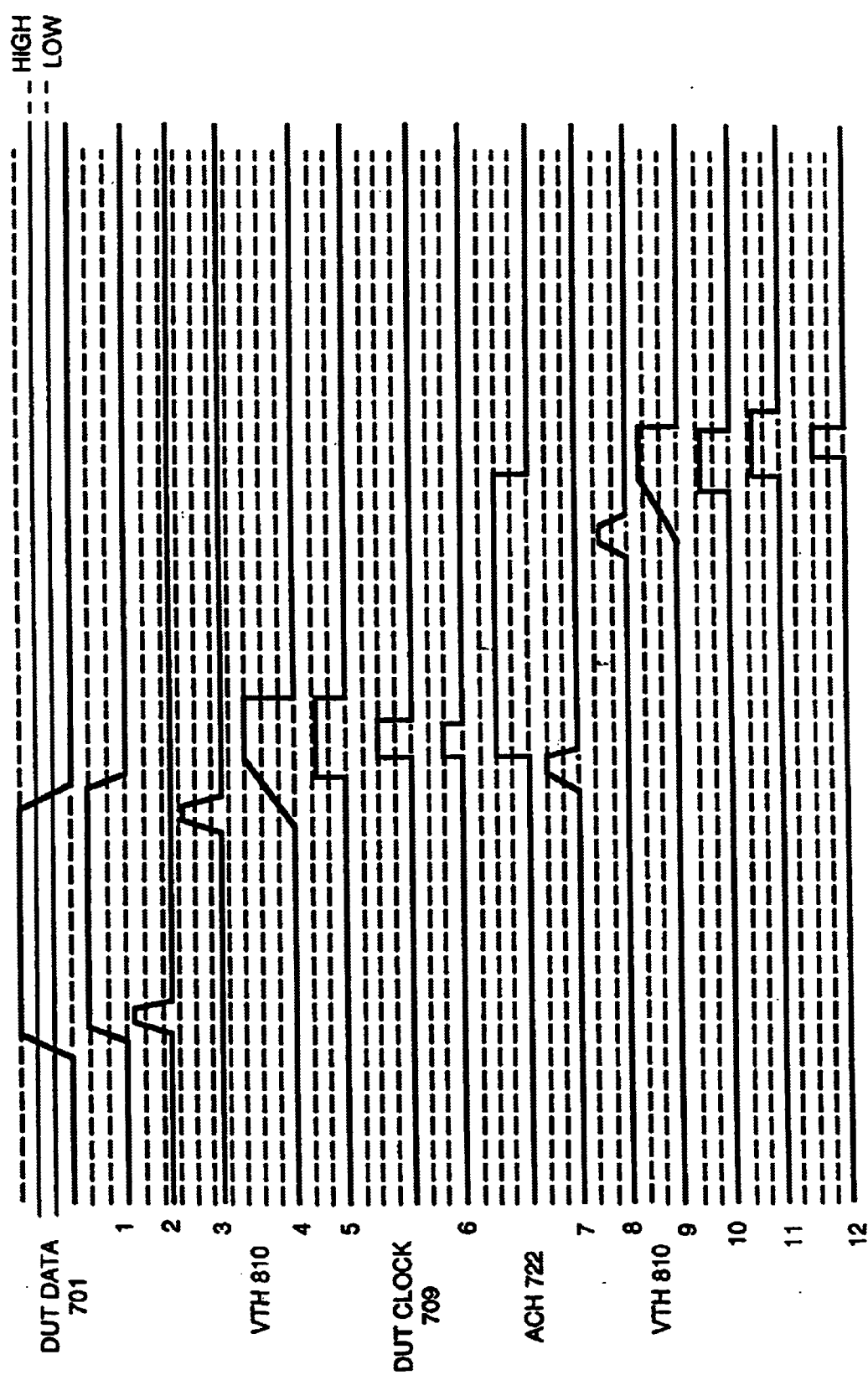
FIG. 9 shows a timing diagram for the circuit shown in FIG. 8.

Input stage 800 shown in FIG. 8 is an ATE input stage in another embodiment of the invention. In circuit 800, comparator 702, positive edge glitcher 703, programmable delay network 725, and ramp generator 706 function as in circuit 700 described above. A ramp signal from ramp generator 706 is compared to a reference voltage VTH 810. Comparator 803 outputs a HIGH to an input terminal of AND-gate 811 when the ramp signal exceeds VTH 810. By adjusting VTH 810, the arrival of a HIGH input to AND-gate 811 can be delayed. This effectively adds additional delay to data signal 701. The delayed data signal 701, which appears as a HIGH input to AND-gate 811, is gated using DUT clock signal 709 which is delayed by programmable delay network 724. Ramp generator 706 is also reset by DUT clock signal 709 through fixed delay network 710. A HIGH data signal 701 and a HIGH DUT clock 709 on the input terminals of AND-gate 811 cause S-R flip-flop 713 to be set. The resulting ACH 722 is, therefore, a stable signal which represents the state of DUT data signal 701 relative to DUT clock signal 709. In the case where DUT data signal 701 is lower than VOH 704, comparator 702 would output a LOW which would result in a delayed narrow pulse at point 8. The time delay provided by programmable delay network 806 is the same as that of delay network 725 as indicated by dash line 812. The narrow pulse at point 8 triggers ramp generator 802 to output a ramp signal. Once the ramp signal rises above VTH 810, the output of comparator 804 becomes HIGH and is presented to the reset input terminal of S-R flip-flop 713 through a driver 805. This results in ACH 722 being LOW which is appropriate because the circuit for BCL 721, not ACH 722, is primarily used when the expected DUT data signal is LOW. The logic HIGH on the reset input of S-R flip-flop 713 resets ramp generator 802 via a positive edge glitcher 813. FIG. 9 shows a timing diagram for circuit 800. As in circuits 500 and 700, the delays in circuit 800 are used to deskew path signal errors and to provide time for the buffering and distribution of the DUT clock.

In circuit 800, the circuit for generating BCL 721 is analogous to the circuit for generating ACH 722. As shown in FIG. 8, the circuit for generating BCL 721, which is used for testing the logic LOW state of DUT data signal 701, includes a reference voltage 705, a comparator 870, negative edge glitcher 723, a positive edge glitcher 852 consisting of inverter 853 and AND-gate 854, programmable delay networks 855-856, a fixed delay network 857, ramp generators 858 and 861, reference voltage VTH 814, comparators 859 and 862, an AND-gate 86, S-R flip-flop 720, a positive edge glitcher consisting of an inverter 864 and an AND-gate 865, and a driver 863.

It is to be understood that the description of the invention given above is for purposes of illustration and is not intended to be limiting. Numerous variations are possible within the scope of the invention. For example, a single comparator may be used to test both the HIGH and LOW levels of a DUT data signal. In which case, the reference voltage used by the comparator is set to a mid-point to determine whether the DUT data signal is above or below the reference voltage. The invention is set forth in the following claims.

I claim:

1. In a test system, a method for obtaining output signals from a device under test ("DUT") outputting source synchronous signals comprising the acts of:
    (a) delaying a source synchronous output data signal from the DUT;
    (b) delaying a source synchronous output clock signal from the DUT;
    (c) holding the delayed source synchronous output data signal;
    (d) releasing the delayed source synchronous output data signal as a function of the delayed source synchronous output clock signal; and (e) comparing the released delayed source synchronous data signal with an expected value.

2. The method of claim 1 wherein the operation of holding comprises latching the delayed source synchronous output data signal.

3. The method of claim 2 wherein the operation of releasing comprises strobing the latched delayed source synchronous output data signal as a function of the delayed source synchronous output clock signal.

4. The method of claim 1 wherein the operation of delaying the source synchronous output data signal further comprises deskewing path errors of the source synchronous output data signal.

5. The method of claim 1 wherein the operation of delaying the source synchronous output clock signal further comprises deskewing path errors of the source synchronous output clock signal.

6. The method of claim 1 further comprising, prior to the operation of delaying a source synchronous output data signal from the DUT, comparing the source synchronous output data signal to a reference voltage.

7. The method of claim 6 further comprising comparing the source synchronous output data signal to a high reference voltage.

8. The method of claim 6 further comprising comparing the source synchronous output data signal to a low reference voltage.

9. The method of claim 6 further comprising edge glitching the compared source synchronous output data signal.

10. The method of claim 6 further comprising positive edge glitching the compared source synchronous output data signal.

11. The method of claim 6 further comprising negative edge glitching the compared source synchronous output data signal.

12. The method of claim 6 further comprising triggering a ramp signal as a function of the delayed source synchronous output data signal.

13. The method of claim 12 further comprising comparing the ramp signal to at least one reference voltage.

14. The method of claim 13 further comprising gating the delayed source synchronous output data signal with the delayed source synchronous output clock signal.

15. The method of claim 14 wherein the operation of releasing comprises triggering a flip-flop output as a function of the delayed source synchronous output data signal.

16. An apparatus for testing an electronic device under test ("DUT") outputting source synchronous signals, the DUT including a data output terminal and a clock output terminal, the apparatus comprising:

at least one comparator having a first input terminal adapted for coupling with a reference voltage and a second input terminal adapted for coupling with the data output terminal of the DUT, the comparator having an output terminal;

at least one first delay element coupled with the output terminal of the comparator, the at least one first delay element having a delayed output;

at least one second delay element adapted for coupling with the clock output terminal of the DUT, the at least one second delay element having a second delayed output;

a buffer having a first input terminal coupled with the delayed output from the at least one first delay element, the buffer having a second input terminal coupled with the second delayed output from the at least one second delay element;

a comparator coupled with the buffer, the comparator further coupled with an expected value signal; and whereby the buffer is adapted to release a delayed source synchronous signal from the DUT upon receipt of a delayed clock signal from the DUT.

17. The apparatus of claim 16 wherein the buffer comprises a latch.

18. The apparatus of claim 16 wherein the buffer comprises an AND gate.

19. The apparatus of claim 16 further comprising an edge glitcher coupled between the at least one comparator and the at least one first delay element.

20. The apparatus of claim 16 wherein the at least one first delay element comprises a programmable delay element.

21. The apparatus of claim 20 further comprising a flip flop coupled with the programmable delay element, the at least one first delay element, and the buffer.

22. The apparatus of claim 20 wherein the at least one second delay element comprises a programmable delay element.

23. The apparatus of claim 20 further comprising a ramp generator coupled with the at least one first delay element.

24. The apparatus of claim 23 further comprising at least one second comparator coupled with the ramp generator.

25. The apparatus of claim 24 further comprising an AND gate coupled with the at least one second comparator and the at least one second delay element.

26. The apparatus of claim 25 further comprising a flip flop operably coupled with the AND gate.

* * * * *

UNITED STATES PATENT AND TRADEMARK OFFICE
CERTIFICATE OF CORRECTION

PATENT NO. : 6,775,637 B2
DATED : August 10, 2004
INVENTOR(S) : Rodolfo F. Garcia It is certified that error appears in the above-identified patent and that said Letters Patent is hereby corrected as shown below:

Title page,
Item [*] Notice, delete "This patent issued on a continued prosecution application filed under 37 CFR 1.53(d), and is subject to the twenty year patent term provisions of 35 U.S.C. 1.54(a)(2)".

Signed and Sealed this

Twenty-seventh Day of September, 2005

JON W. DUDAS
*Director of the United States Patent and Trademark Office*